(12) United States Patent
Kwak et al.

(10) Patent No.: US 11,508,769 B2
(45) Date of Patent: Nov. 22, 2022

(54) IMAGE SENSING DEVICE

(71) Applicant: SK hynix Inc., Icheon-si (KR)

(72) Inventors: Ho Young Kwak, Cheongju-si (KR);
Hyung June Yoon, Yongin-si (KR);
Jong Eun Kim, Daejeon (KR)

(73) Assignee: SK hynix Inc., Icheon-si (KR)

( * ) Notice: Subject to any disclaimer, the term of this patent is extended or adjusted under 35 U.S.C. 154(b) by 227 days.

(21) Appl. No.: 16/859,855

(22) Filed: Apr. 27, 2020

(65) Prior Publication Data
US 2021/0104569 A1     Apr. 8, 2021

(30) Foreign Application Priority Data

Oct. 8, 2019   (KR) .......................... 10-2019-0124645

(51) Int. Cl.
| | | |
|---|---|---|
| *H01L 27/146* | (2006.01) | |
| *H04N 5/378* | (2011.01) | |
| *H04N 5/369* | (2011.01) | |
| *G01S 17/08* | (2006.01) | |

(52) U.S. Cl.
CPC .... *H01L 27/14629* (2013.01); *H01L 27/1463* (2013.01); *H01L 27/14607* (2013.01); *H01L 27/14614* (2013.01); *H01L 27/14643* (2013.01); *H04N 5/378* (2013.01); *H04N 5/379* (2018.08); *G01S 17/08* (2013.01)

(58) Field of Classification Search
CPC ......... H01L 27/14629; H01L 27/14607; H01L 27/14614; H01L 27/1463; H01L 27/14643; H04N 5/378; H04N 5/379; G01S 17/08
See application file for complete search history.

(56) References Cited

U.S. PATENT DOCUMENTS

2019/0342510 A1*  11/2019  Sano ................. H01L 27/14629
2020/0020731 A1*   1/2020  Watanabe ......... H01L 27/14623

FOREIGN PATENT DOCUMENTS

| KR | 10-0081548 A | 7/2010 |
|---|---|---|
| KR | 2010-0081548 A | 7/2010 |
| KR | 10-1436504 B | 9/2014 |

* cited by examiner

*Primary Examiner* — Thanh Luu
(74) *Attorney, Agent, or Firm* — Perkins Coie LLP

(57) ABSTRACT

An image sensing device is disclosed. The image sensing device includes a semiconductor substrate, a plurality of signal detectors, an insulation layer, and at least one gate. The semiconductor substrate includes a first surface and a second surface opposite to the first surface, and generates signal carriers in response to light incident upon the first surface. The signal detectors are formed on the semiconductor substrate and located closer to the second surface than the first surface of the semiconductor substrate, and detect the signal carriers using a difference in electric potential. The insulation layer is disposed at the second surface of the semiconductor substrate, and isolates the signal detectors from each other. The at least one gate is disposed at the insulation layer interposed between the signal detectors, and reflects light arriving at the second surface of the semiconductor substrate back to the semiconductor substrate.

20 Claims, 4 Drawing Sheets

IMAGE SENSING DEVICE

CROSS-REFERENCE TO RELATED APPLICATION

This patent document claims the priority and benefits of Korean patent application No. 10-2019-0124645, filed on Oct. 8, 2019, which is incorporated by reference in its entirety as part of the disclosure of this patent document.

TECHNICAL FIELD

The technology and implementations disclosed in this patent document generally relate to an image sensing device.

BACKGROUND

An image sensor is a semiconductor device for converting an optical image into electrical signals. Recently, with the increasing development of computer industries and communication industries, demand for high-quality and high-performance image sensors has been rapidly increasing in concert with in various electric devices, for example, digital cameras, camcorders, personal communication systems (PCSs), video game consoles, surveillance cameras, medical micro-cameras, robots, etc.

In order to acquire a three-dimensional (3D) image using the image sensor, color information of the 3D image and the distance (or depth) between a target object and the image sensor are needed.

A method for acquiring information about the distance between the target object and the image sensor may be classified into a passive method and an active method.

The passive method may calculate the distance between the target object and the image sensor using only image information of the target object without emitting light to the target object. The passive method can be applied to stereo cameras.

The active method may be classified into a triangulation method, a Time of Flight (TOF) method, etc. After light has been emitted from a light source (e.g., a laser source) spaced apart from the image sensor by a predetermined distance, the triangulation method may sense light reflected from a target object, and may calculate the distance between the target object and the image sensor using the sensing result. After light has been emitted from the light source to the target object, the TOF method may measure time duration in which light is reflected from the target object and returns to the image sensor, such that the TOF method may calculate the distance between the target object and the image sensor using the measurement result.

Image sensors may be classified into CCD (Charge Coupled Device)-based image sensors and CMOS (Complementary Metal Oxide Semiconductor)-based image sensors. The CMOS image sensors can be fabricated to have lower power consumption, lower production costs, and smaller size than the CCD image sensors. Thus, the CMOS image sensors have been widely used in mobile devices, for example, smartphones, digital cameras, etc.

SUMMARY

The disclosed technology relates to an image sensing device which measures depth information such as a distance from the image sensing device to a target object.

The disclosed technology relates to an image sensing device including a reflective structure that is freely formed irrespective of a layout structure of a line layer (or an interconnect layer).

In accordance with an embodiment of the disclosed technology, an image sensing device may include a semiconductor substrate including a first surface and a second surface opposite to the first surface, and configured to generate signal carriers in response to light incident upon the first surface, a plurality of signal detectors formed on the semiconductor substrate and located closer to the second surface than the first surface of the semiconductor substrate, and configured to detect the signal carriers using a difference in electric potential, an insulation layer disposed at the second surface of the semiconductor substrate, and configured to isolate the signal detectors from each other, and at least one gate disposed at the insulation layer interposed between the signal detectors, and configured to reflect light arriving at the second surface of the semiconductor substrate back to the semiconductor substrate.

In accordance with another embodiment of the disclosed technology, an image sensing device may include a pixel array including a plurality of unit pixels arranged in a first direction and in a second direction perpendicular to the first direction, the unit pixels configured to generate signal carriers in response to reception of light incident upon a semiconductor substrate. The pixel array may include sub-pixel arrays, each sub-pixel array including unit pixels arranged in the first direction, and one or more gates disposed between the unit pixels, the one or more gates configured to reflect light into the semiconductor substrate, and a pixel transistor array disposed between the sub-pixel arrays in the second direction and including pixel transistors arranged in the first direction and configured to read out photoelectric conversion signals acquired from the unit pixels, the photoelectric conversion signals corresponding to the signal carriers.

It is to be understood that both the foregoing general description and the following detailed description of the disclosed technology are illustrative and explanatory and are intended to provide further explanation of the disclosure as claimed.

BRIEF DESCRIPTION OF THE DRAWINGS

The above and other features and beneficial aspects of the disclosed technology will become readily apparent with reference to the following detailed description when considered in conjunction with the accompanying drawings.

DETAILED DESCRIPTION

This patent document provides implementations and examples of image sensing devices that substantially address one or more issues due to limitations and disadvantages of the related art. Some implementations of the disclosed technology suggest designs of an image sensing device for increasing usage efficiency of incident light. Some implementations of the disclosed technology suggest designs of an image sensing device having a reflective structure that can be freely formed irrespective of a layout structure of a line layer.

Reference will now be made in detail to certain embodiments, examples of which are illustrated in the accompanying drawings. In general, the same reference numbers will be used throughout the drawings to refer to the same or similar parts. In the following description, a detailed description of related known configurations or functions incorporated herein will be omitted to avoid obscuring the subject matter.

Figure 1:
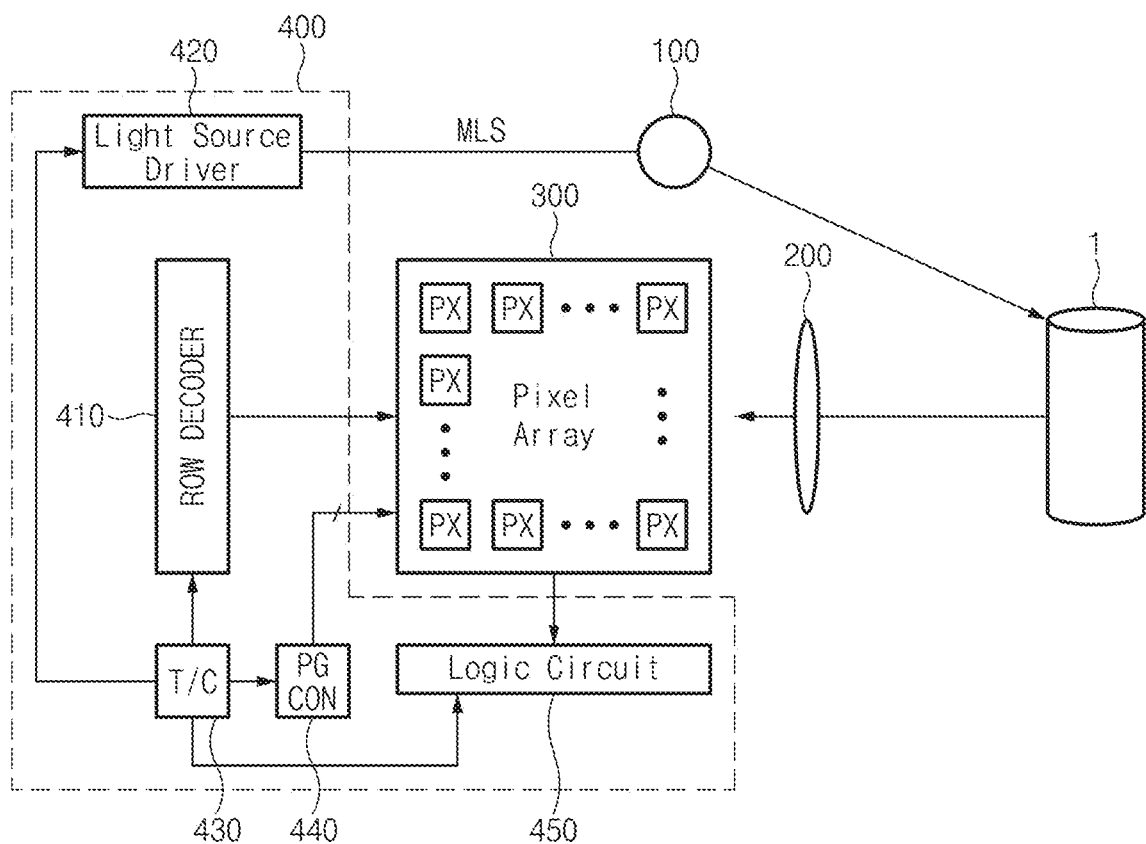
FIG. 1 is an example of a block diagram illustrating an image sensing device based on some implementations of the disclosed technology.

FIG. 1 is a block diagram illustrating an image sensing device according to an embodiment of the disclosed technology.

Referring to FIG. 1, the image sensing device may measure the distance using the Time of Flight (TOF) technique. The image sensing device may include a light source 100, a lens module 200, a pixel array 300, and a control circuit 400.

The light source 100 may emit light to a target object 1 upon receiving a clock signal MLS (modulated light signal) from the control circuit 400. The light source 100 may be a laser diode (LD) or a light emitting diode (LED) for emitting infrared light or visible light, or may be any one of a Near Infrared Laser (NIR), a point light source, a monochromatic light source combined with a white lamp or a monochromator, and/or a combination of other laser sources. For example, the light source 100 may emit infrared light having a wavelength of 800 nm to 1000 nm. Although FIG. 1 shows only one light source 100 for convenience of description, other implementations are possible. For example a plurality of light sources may also be arranged in the vicinity of the lens module 200.

The lens module 200 may collect light reflected from the target object 1, and may allow the collected light to be focused onto pixels (PXs) of the pixel array 300. The lens module 200 may include a focusing lens having a surface formed of or including glass or plastic, or other cylindrical optical elements having a surface formed of or including glass or plastic. The lens module 200 may include a focusing lens having a convex structure.

The pixel array 300 may include unit pixels (PXs) arranged in a two-dimensional (2D) structure including a column direction and a row direction perpendicular to the column direction. The unit pixels (PXs) may be formed in a semiconductor substrate, and each unit pixel (PX) may convert light received through the lens module 200 into an electrical signal corresponding to the received light such that each unit pixel can output a pixel signal. In this case, the pixel signal may be a signal for indicating the distance to the target object 1, instead of a signal indicating a color of the target object 1. Each unit pixel (PX) may be a Current-Assisted Photonic Demodulator (CAPD) pixel for detecting signal carriers generated in a substrate by incident light using a difference between potential levels of an electric field. The light is incident on a first surface of the substrate of the unit pixels (PXs). The pixel array 300 may include a reflective structure to reflect the incident light that has penetrated the substrate back to the substrate. The reflective structure may include dummy gates formed over a second surface (facing the first surface) of the substrate between signal detectors in which a control region and a detection region are included.

The control circuit 400 may emit light to the target object 1 by controlling the light source 100, process each pixel signal corresponding to light reflected from the target object 1 by driving unit pixels (PXs) of the pixel array 300, and measure the distance to the surface of the target object 1.

The control circuit 400 may include a row decoder 410, a light source driver 420, a timing controller 430, a photogate controller 440, and a logic circuit 450.

The row decoder 410 may drive unit pixels (PXs) of the pixel array 300 in response to a timing signal generated from the timing controller 430. For example, the row decoder 410 may generate a control signal capable of selecting at least one of the plurality of row lines. The control signal may include a selection signal for controlling the selection transistor and a transmission (Tx) signal for controlling transfer gates.

The light source driver 420 may generate a clock signal MLS capable of driving the light source 100 in response to a control signal from the timing controller 430. The light source driver 420 may supply either the clock signal MLS or information about the clock signal MLS to the photogate controller 440.

The timing controller 430 may generate a timing signal to control the row decoder 410, the light source driver 420, the photogate controller 440, and the logic circuit 450.

The photogate controller 440 may generate photogate control signals in response to a control signal of the timing controller 430, and may supply the photogate control signals to the pixel array 300. Although FIG. 1 illustrates only the photogate controller 440 for convenience of description, the control circuit 400 may include a photodiode controller that generates a plurality of photodiode control signals in response to a control signal of the timing controller 430 and then transmits the photodiode control signals to the pixel array 300.

The logic circuit 450 may process pixel signals received from the pixel array 300 under control of the timing controller 430, and may thus calculate the distance to the target object 1. The logic circuit 450 may include a correlated double sampler (CDS) circuit for performing correlated double sampling (CDS) on the pixel signals generated from the pixel array 300. In addition, the logic circuit 450 may include an analog-to-digital converter (ADC) for converting output signals of the CDS circuit into digital signals.

Figure 2:
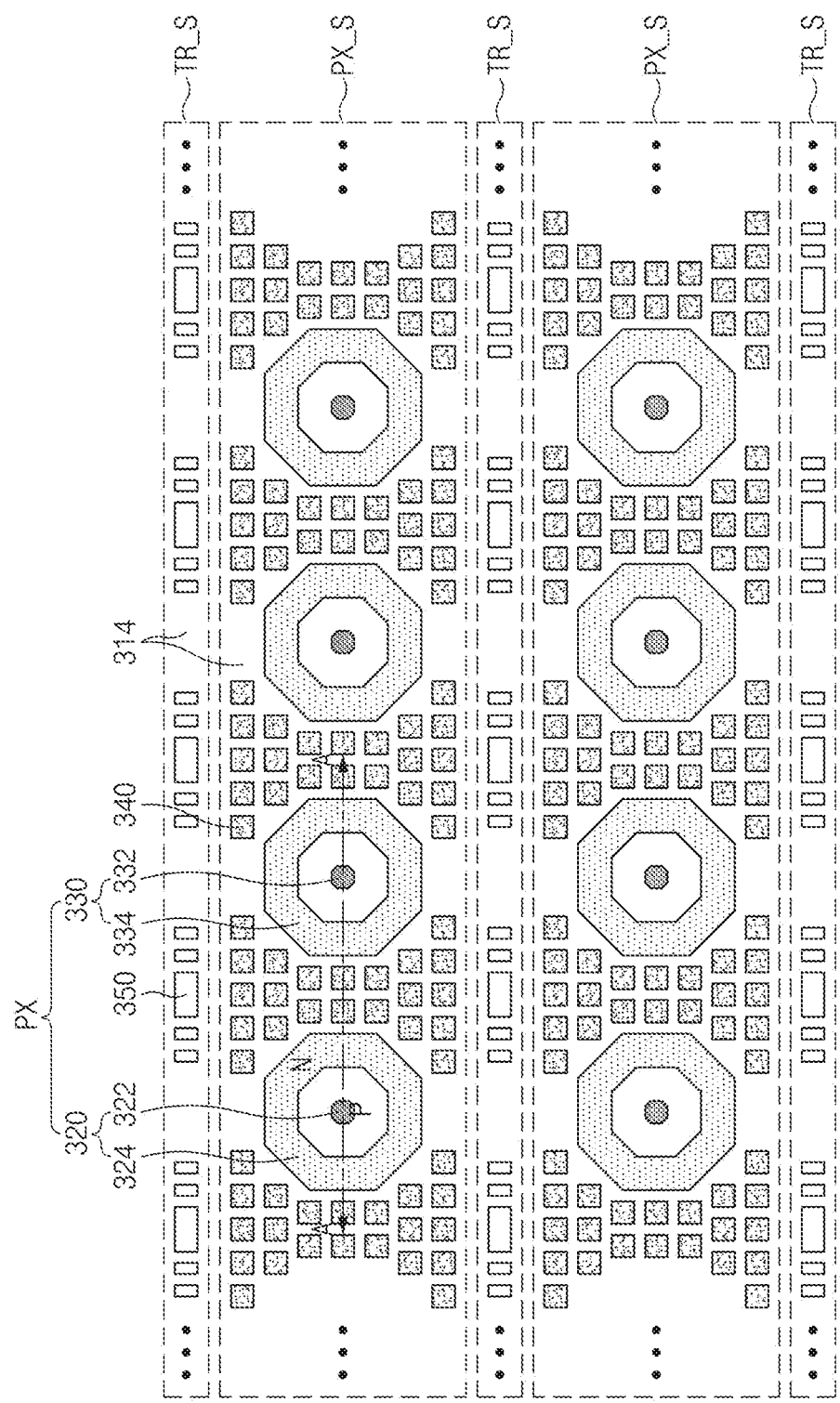
FIG. 2 is a schematic diagram illustrating an example of unit pixels contained in a pixel array shown in FIG. 1 based on some implementations of the disclosed technology.
Figure 3:
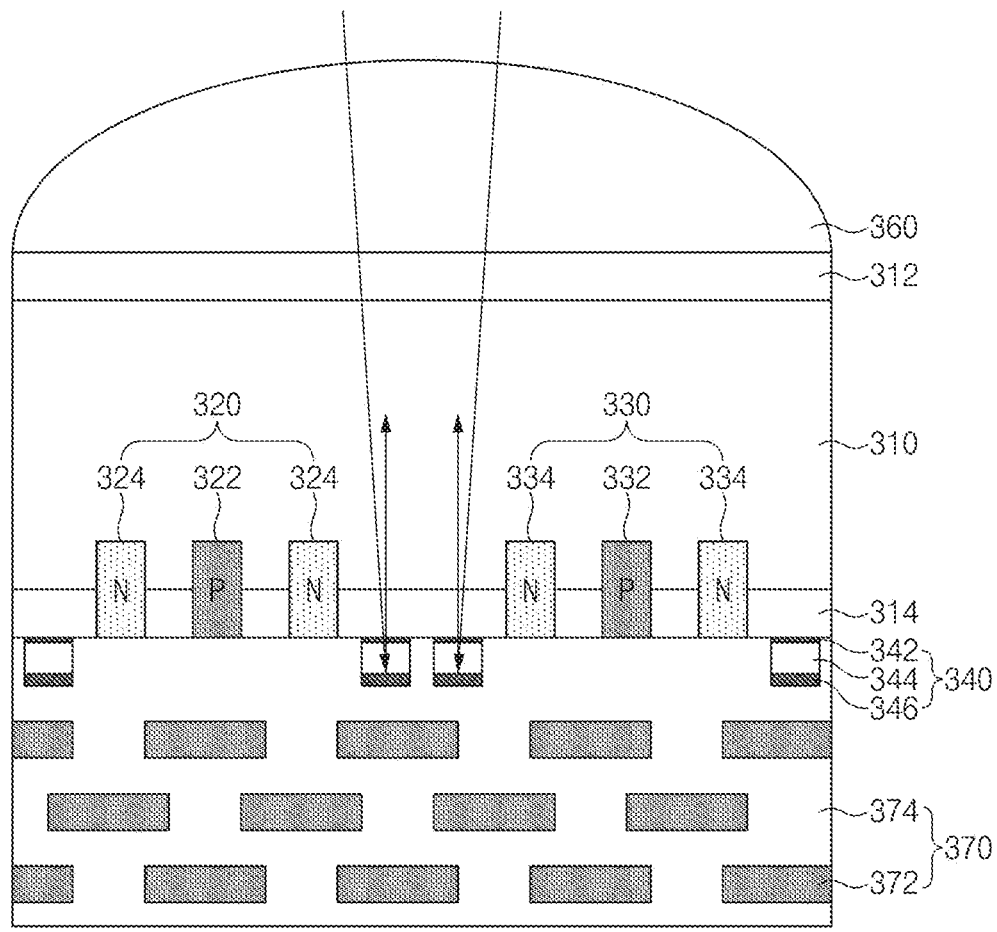
FIG. 3 is a cross-sectional view illustrating an example of a pixel array taken along the line A-A' shown in FIG. 2 based on some implementations of the disclosed technology.

FIG. 2 is a schematic diagram illustrating an example of unit pixels contained in the pixel array 300 shown in FIG. 1. FIG. 3 is a cross-sectional view illustrating an example of the pixel array 300 taken along the line A-A' shown in FIG. 2.

Referring to FIGS. 2 and 3, the pixel array 300 may include unit pixels (PXs) consecutively arranged in a first direction and a second direction perpendicular to the first direction.

For example, the pixel array 300 may include a plurality of sub-pixel arrays (PX_S) and a plurality of pixel transistor arrays (TR_S).

Each sub-pixel array (PX_S) may include a plurality of unit pixels (PXs) arranged in a first direction. Each unit pixel (PX) may include a pair of signal detectors 320 and 330 that are located contiguous or adjacent to each other. The signal detector 320 may include a control region 322 and a detection region 324. Another signal detector 330 which is arranged adjacent to the signal detector 320 may include a control region 332 and a detection region 334. The dummy gates 340 for light reflection may be disposed between two signal detectors 320 and 330. The dummy gates 340 may also be disposed between adjacent unit pixels (PXs).

Each of the control regions 322 and 332 may include a P-type impurity region. Each of the control regions 322 and 332 may include a P(+) diffusion region and a P-well. Each of the detection regions 324 and 334 may include an N-type impurity region. Each of the detection regions 324 and 334 may include an N (+) diffusion region and an N-well. Each of the control regions 322 and 332 may be coupled to the row decoder 410 through conductive lines 372, and may receive a demodulation control signal from the row decoder 410. In each unit pixel (PX), a potential difference between the demodulation control signal applied to the control region 322 and another demodulation control signal applied to the control region 332 may generate an electric field (or a hole current) that controls flow of signal carriers generated in the substrate 310 by incident light. In some implementations, the control regions 322 and 332 may generate a plurality of carrier currents (hole currents) in the substrate 310 based on the demodulation control signals. When signal carriers (electrons) generated by incident light applied to the substrate 310 move in response to hole currents, the detection regions 324 and 334 may capture the moving signal carriers.

The detection regions 324 of the signal detector 320 may be formed to surround the control region 322. The detection regions 334 of the signal detector 330 may be formed to surround the control region 332. Although each of the detection regions 324 and 334 shown in FIG. 2 is formed in an octagonal band shape for convenience of description, other implementations are also possible. Thus, each detection region 324 or 334 can also be formed in a circular or any polygonal shape as needed. In some implementations, the detection region 324 can be formed in a shape which does not completely surround the control region 322. In some implementations, at least some parts of the detection region 324 may be isolated. The detection region 334 can also be formed in a shape which does not completely surround the control region 332. In some implementations, at least some parts of the detection region 334 may be isolated.

An active region in which the control regions 322 and 332 and the detection regions 324 and 334 are formed may be defined by an insulation layer 314. For example, the control regions 322 and 332 and the detection regions 324 and 334 may be physically isolated by the insulation layer 314. The insulation layer 314 may be formed in a shallow trench isolation (STI) structure in which an insulation material is buried in a trench formed when a second surface of the substrate 310 is etched to a predetermined depth. The insulation layer 314 may include an oxide film.

In each of the sub-pixel arrays (PX_S), dummy gates 340 for light reflection may be formed over the insulation layer 314 disposed between the signal detectors 320 and 330. For example, the dummy gates 340 for light reflection may be formed over the insulation layer that is disposed over a second surface of the substrate 310. Here, the second surface of the substrate 310 may be opposite to the first surface on which light is incident. The dummy gates 340 for light reflection may reflect light back to the substrate 310 when the light has penetrated the substrate 310 without the photoelectric conversion. In some implementations, the dummy gates 340 may be smaller in size than the signal detectors 320 and 330 and the dummy gates 340 can be evenly or uniformly distributed in the region between the signal detectors 320 and 330. Although each of the dummy gates 340 shown in FIG. 2 is formed in a square shape, the disclosed technology is not limited thereto. Thus, the dummy gates 340 can also be formed in other shapes as necessary. For example, each of the dummy gates 340 may be formed in a circular shape or any polygonal shapes other than the square shape. In some implementations, although the dummy gates 340 shown in FIG. 2 are identical in shape to each other, it should be noted that the dummy gates 340 may also be formed in different shapes from each other.

Each of the pixel transistor arrays (TR_S) may be disposed between the sub-pixel arrays (PX_S) in the second direction. Each of the pixel transistor arrays (TR_S) may include a plurality of pixel transistors 350 arranged in the first direction. Each of the pixel transistors 350 of the pixel transistor array (TR_S) may read out pixel signals from the unit pixels of the neighboring sub-pixel array (PX_S), and may output the pixel signals to the column line. For example, each of the pixel transistors 350 may read out pixel signals corresponding to signal carriers captured by the detection regions 324 and 334.

The pixel transistors 350 may include a transfer transistor, a reset transistor, a source follower transistor, and a selection transistor that are arranged in the first direction. The pixel transistors 350 may be formed in the active region defined by the insulation layer 314.

The transfer transistor may be coupled to the detection regions 324 and 334, and may transmit signal carriers captured by the detection regions 324 and 334 to the floating diffusion (FD) region according to a transmission control signal. The reset transistor may reset the floating diffusion (FD) region according to a reset signal. The source follower transistor may generate a pixel signal corresponding to the magnitude of an electric potential of the floating diffusion (FD) region. The selection transistor may output the pixel signal generated from the source follower transistor to the column line according to a selection signal. Pixel signals corresponding to signal carriers captured by the detection region 324 and pixel signals corresponding to signal carriers captured by the other detection region 334 may be output through different column lines. The transmission control signal, the reset signal, and the selection signal may be received from the row decoder 410.

The substrate 310 may include a semiconductor substrate, for example, a P-type semiconductor substrate. The substrate 310 may include a first surface on one side of the substrate 310 and a second surface on the other side of the substrate 310 opposite to the first surface. The first surface of the substrate 310 may be used as a light incident surface.

A P-type impurity region 312 having a predetermined depth may be formed below the first surface of the substrate 310. A lens layer 360 for converging incident light may be formed over the first surface of the substrate 310. An anti-reflection film (not shown) may also be formed between the substrate 310 and the lens layer 360. The lens layer 360 may include a plurality of microlenses for each unit pixel (PX).

The insulation layer 314 and the signal detectors 320 and 330 may be formed below the second surface of the substrate 310. The signal detectors 320 and 330 may be physically isolated from each other by the insulation layer 314.

The dummy gates 340 for light reflection may be formed over the insulation layer 314. Each of the dummy gates 340 for light reflection may have a same structure as those of the pixel transistors 350 or the control circuit 400. In some implementations, the dummy gates 340 for light reflection may be formed over the insulation layer 314 and may be not located in the active region.

Each of the dummy gates 340 for light reflection may include a gate insulation layer 342, a polysilicon film 344, and a metal film 346. In this case, the metal film 346 may include a silicide film, for example, a cobalt silicide (CoSix) film or a nickel silicide (NiSix) film. Light which has penetrated the substrate 310 may be reflected from the metal film 346 of the light-reflection dummy gate 340, and may be re-incident upon the substrate 310, as denoted by arrows shown in FIG. 3. The dummy gates 340 for light reflection and gates of the pixel transistors 350 and/or the control circuit 400 may be simultaneously formed.

A line layer 370 (also called an interconnect layer) including a plurality of conductive lines 372 and an interlayer insulation layer 374 may be formed over the second surface of the substrate 310. The conductive lines 372 may include conductive lines for transmitting signals needed to operate the unit pixels (PX) and the pixel transistors 350. In some implementations, the conductive lines 372 may include conductive lines for transmitting a photoelectric conversion signal and a pixel signal corresponding to the photoelectric conversion signal. Each of the conductive lines 372 may include at least one of aluminum (Al), copper (Cu), or tungsten (W). The conductive lines 372 may be coupled to the control regions 322 and 332, the detection regions 324 and 334, and the pixel transistors 350 through a contact plug (not shown). The interlayer insulation layer 374 may include a stacked structure of the plurality of insulation layers. The interlayer insulation layer 374 may include at least one of an oxide film or a nitride film.

Figure 4:
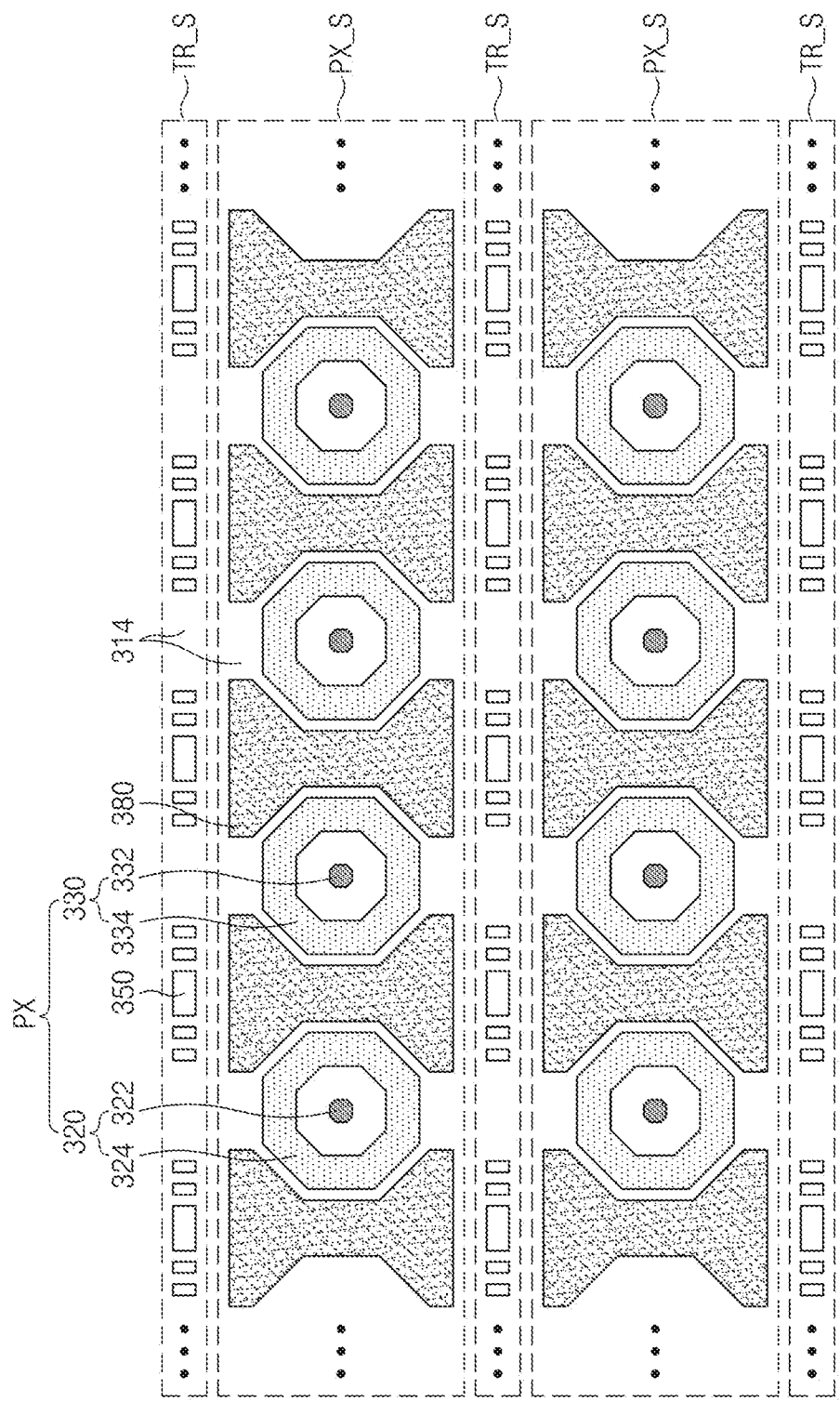
FIG. 4 is a schematic diagram illustrating another example of unit pixels contained in a pixel array shown in FIG. 1 based on some implementations of the disclosed technology.

FIG. 4 is a schematic diagram illustrating another example of unit pixels contained in the pixel array shown in FIG. 1 based on some implementations of the disclosed technology.

Referring to FIG. 4, the dummy gates 380 for light reflection according to the present embodiment may have a different shape from those of the light-reflection dummy gates 350 shown in FIG. 2.

As can be seen from FIG. 2, each of the light-reflection dummy gates 340 is smaller in size than each of the signal detectors 320 and 330 and the light reflection dummy gates 340 may be evenly or uniformly distributed between the signal detectors 320 and 330. In FIG. 4, a single dummy gate 380 which has a relatively larger size is disposed for light reflection between the signal detectors 320 and 330. The dummy gate 380 may be located to fill a space between the signal detectors 320 and 330 and have a size to minimize the space not filled by the dummy gate 380. For example, the dummy gates 380 for light reflection may be formed to surround side surfaces of the signal detectors 320 and 330 located at both sides of each dummy gate 380.

The light-reflection dummy gates 340 shown in FIG. 2 and the light-reflection dummy gates 380 shown in FIG. 4 are merely examples, and the shapes of the light-reflection dummy gates 340 and 380 are not limited thereto. Thus, the light-reflection dummy gates 340 and 380 may also be formed in any other shapes as long as the light-reflection dummy gates 340 and 380 operates to reflect the light penetrated the substrate 310 back to the substrate 310.

Each dummy gate 380 for light reflection may also be formed as a stacked structure of a gate insulation layer, a polysilicon film, and a metal film (silicide film) which are formed over the insulation layer 314. In some implementations, the dummy gates 380 for light reflection and gates of the pixel transistors 350 and/or the control circuit 400 can be simultaneously formed.

The remaining constituent elements other than the light-reflection dummy gates 380 shown in FIG. 4 are identical to those of FIG. 2, and as such a detailed description thereof will herein be omitted.

As is apparent from the above description, the image sensing device according to the embodiments of the disclosed technology can allow light that has passed through a semiconductor substrate without photoelectric conversion, to reenter the semiconductor substrate, resulting in increased efficiency of light.

The image sensing device according to the embodiments of the disclosed technology can include a reflective structure that is freely formed irrespective of a layout structure of the line layer.

Those skilled in the art will appreciate that the embodiments may be carried out in other various ways than those set forth herein. The above embodiments are therefore to be construed in all aspects as illustrative and not restrictive.

Although a number of illustrative embodiments have been described, it should be understood that numerous other modifications and embodiments can be devised based on this disclosure. Particularly, variations and modifications are possible in the component parts and/or arrangements which are within the scope of the disclosure, the drawings and the accompanying claims. In addition to variations and modifications in the component parts and/or arrangements, alternative uses may also be possible.

What is claimed is:

1. An image sensing device comprising:
a semiconductor substrate including a first surface and a second surface opposite to the first surface, and configured to generate signal carriers in response to light incident upon the first surface;
a plurality of signal detectors formed on the semiconductor substrate and located closer to the second surface than the first surface of the semiconductor substrate, and configured to detect the signal carriers using a difference in an electric potential;
an insulation layer disposed at the second surface of the semiconductor substrate, and configured to isolate the signal detectors from each other;
pixel transistors disposed at the second surface of the semiconductor substrate, and configured to read out signal carriers acquired from the signal detectors; and
at least one gate disposed at the insulation layer interposed between the signal detectors, and configured to reflect light arriving at the second surface of the semiconductor substrate back to the semiconductor substrate,
wherein the pixels transistors have a gate having a same stacked structure as that of the at least one gate.

2. The image sensing device according to claim 1, wherein the insulation layer includes an insulation material buried in a trench.

3. The image sensing device according to claim 1, wherein each of the signal detectors includes:
a control region including first-type impurities, and configured to generate hole currents in the semiconductor substrate according to a control signal; and
a detection region including second-type impurities having an opposite conductivity to that of the first-type impurities and configured to capture the signal carriers moving by the hole currents.

4. The image sensing device according to claim 3, wherein the control region and the detection region are isolated from each other by the insulation layer.

5. The image sensing device according to claim 3, wherein the detection region is arranged to surround the control region.

6. The image sensing device according to claim 1, wherein the at least one gate has a smaller size than that of the signal detectors.

7. The image sensing device according to claim 1, wherein the at least one gate is formed to surround side surfaces of the signal detectors located at both sides of the at least one gate.

8. The image sensing device according to claim 1, further comprising a pixel array of unit pixels supported by the semiconductor substrate and structured to convert incident light from a target object into pixel signals carrying image information of the target object, wherein the plurality of signal detectors are part of the pixel array of unit pixels.

9. The image sensing device according to claim 8, further comprising a light source and a light control circuit coupled to control the light source to emit modulated light to the target object, wherein the pixel array of unit pixels detects reflected modulated light from the target object to provide the pixel signals that further carry information of a distance between the target object and the pixel array of unit pixels based on detection of the reflected modulated light from the target object.

10. An image sensing device comprising:
a semiconductor substrate including a first surface and a second surface opposite to the first surface, and configured to generate signal carriers in response to light incident upon the first surface;
a plurality of signal detectors formed on the semiconductor substrate and located closer to the second surface than the first surface of the semiconductor substrate, and configured to detect the signal carriers using a difference in an electric potential;
an insulation layer disposed at the second surface of the semiconductor substrate, and configured to isolate the signal detectors from each other;
at least one gate disposed at the insulation layer interposed between the signal detectors, and configured to reflect light arriving at the second surface of the semiconductor substrate back to the semiconductor substrate, and
wherein the at least one gate includes:
a gate insulation layer;
a polysilicon film formed over the gate insulation layer; and
a metal film formed over the polysilicon film.

11. The image sensing device according to claim 10, wherein the metal film includes a silicide film.

12. An image sensing device comprising:
a pixel array including a plurality of unit pixels arranged in a first direction and a second direction perpendicular to the first direction, the unit pixels configured to generate signal carriers in response to reception of light incident upon a semiconductor substrate,
wherein the pixel array includes:
sub-pixel arrays, each sub-pixel array including unit pixels arranged in the first direction, and one or more gates disposed between the unit pixels, the one or more gates configured to reflect light into the semiconductor substrate; and
a pixel transistor array disposed between the sub-pixel arrays in the second direction and including pixel transistors arranged in the first direction and configured to read out photoelectric conversion signals acquired from the unit pixels, the photoelectric conversion signals corresponding to the signal carriers, and
wherein the pixel transistors have a gate having a same staked structure as that of the one or more gates.

13. The image sensing device according to claim 12, wherein each of the unit pixels includes:
a plurality of signal detectors configured to generate a potential difference in the semiconductor substrate in response to a control signal, and detect the signal carriers using the potential difference.

14. The image sensing device according to claim 13, further comprising:
an insulation layer including an insulation material and configured to isolate the signal detectors from each other.

15. The image sensing device according to claim 14, wherein the one or more gates are disposed over the insulation layer interposed between the signal detectors.

16. The image sensing device according to claim 13, wherein the one or more gates have a size smaller than that of the signal detectors.

17. The image sensing device according to claim 13, wherein the one or more gates are disposed between the signal detectors to surround side surfaces of the signal detectors.

18. The image sensing device according to claim 12, wherein the one or more gates have a structure in which different materials are stacked.

19. The image sensing device according to claim 12, wherein each of the gates includes:
a gate insulation layer;
a polysilicon film formed over the gate insulation layer; and
a metal film formed over the polysilicon film.

20. The image sensing device according to claim 19, wherein the metal film includes a silicide film.

* * * * *